United States Patent
Matsue

[19]

[11] Patent Number: 5,771,191
[45] Date of Patent: Jun. 23, 1998

[54] METHOD AND SYSTEM FOR INSPECTING SEMICONDUCTOR MEMORY DEVICE

[75] Inventor: Kazuki Matsue, Tenri, Japan

[73] Assignee: Sharp Kabushiki Kaisha, Osaka, Japan

[21] Appl. No.: 838,984

[22] Filed: Apr. 23, 1997

[30] Foreign Application Priority Data

Apr. 25, 1996 [JP] Japan ..................................... 8-105422

[51] Int. Cl.$^6$ .................................................. G11C 29/00
[52] U.S. Cl. .................... 365/185.09; 365/201; 371/21.1
[58] Field of Search ......................... 365/185.09, 185.33, 365/201; 371/21.1, 21.2; 395/183.01, 183.18

[56] References Cited

U.S. PATENT DOCUMENTS 5,371,748  12/1994  Saw et al. .................................. 371/27
5,627,838   5/1997  Lin et al. ............................... 371/21.1
5,689,635  11/1997  Petrosino ............................ 395/183.18
5,694,611  12/1997  Matsubara ............................... 395/800

*Primary Examiner*—David C. Nelms
*Assistant Examiner*—Son Mai
*Attorney, Agent, or Firm*—Morrison & Foerster, LLP

[57] ABSTRACT

A method for inspecting a semiconductor memory device by using an inspection microcomputer and a memory for storing a test program for the inspection. The semiconductor memory device includes a non-volatile memory area, a peripheral circuit thereof, a control circuit for controlling writing and erasing of data to and from the non-volatile memory area via the peripheral circuit, and a control bus for connecting the control circuit and the peripheral circuit. The method includes the steps of: deactivating the control circuit; connecting the inspection microcomputer and the memory to the control bus; and inspecting the peripheral circuit and the non-volatile memory area by the inspection microcomputer.

14 Claims, 6 Drawing Sheets

METHOD AND SYSTEM FOR INSPECTING SEMICONDUCTOR MEMORY DEVICE

BACKGROUND OF THE INVENTION

1. Field of the Invention

The present invention relates to a method and system for inspecting an electrically rewritable non-volatile semiconductor memory device. In particular, the present invention relates to a method for inspecting a non-volatile semiconductor memory device including a non-volatile memory area, a peripheral circuit thereof, a control circuit for controlling data writing to and data erasing from the memory area through the peripheral circuit, and a control bus for connecting the control circuit and the peripheral circuit to each other.

2. Description of the Related Art

One exemplary semiconductor memory device including a non-volatile memory area controlled by a control circuit is a flash memory. A memory cell acting as the non-volatile memory area in the flash memory has, for example, the following structure.

FIG. 1 shows an exemplary structure of a memory cell 70 in a flash memory. As shown in FIG. 1, the memory cell 70, which has a 1-cell/1-bit structure, includes a control gate 71, a floating gate 72, a source 73, and a drain 74. The memory cell 70 having such a structure is referred to as a floating gate-type field effect transistor.

The flash memory includes a plurality of memory cells 70. A prescribed number of memory cells 70 are connected to a common source line. FIG. 2 shows a circuit configuration of one block of the flash memory. As shown in FIG. 2, one block includes a plurality of memory cells 70 arranged in a matrix of m (row)×n (column), word lines $81_1$ through $81_m$, and bit lines $82_1$ through $82_n$. In this example, all the memory cells 70 in one block are connected to a common source line 83. The word lines $81_1$ through $81_m$ are each connected to control gates 71 of the memory cells 70 in the corresponding row ("n" being the number of memory cells 70), and the bit lines $82_1$ through $82_n$ are each connected to drains of the memory cells 70 in the corresponding column ("m" being the number of memory cells 70).

The operation of the flash memory having such a structure will be described briefly regarding writing, erasing and reading of data.

Writing data to the memory cell is performed in the following manner. A high voltage (e.g., 12 V) is applied to the control gate 71, a high voltage (e.g., 7 V) is applied to the drain 74, and a low voltage (e.g., 0 V) is applied to the source 73. Then, hot electrons generated in the vicinity of the drain junction are injected into the floating gate 72.

Erasing data from the memory cell is performed in the following manner. A low voltage (e.g., 0 V) is applied to the control gate 71, a low voltage (e.g., 0 V) is applied to the drain 74, and a high voltage (e.g., 12 V) is applied to the source 73. Thus, a sufficiently strong electric field is generated between the floating gate 72 and the source 73, and the electrons in the floating gate 72 are moved to the source 73 via the tunnel effect.

Reading the data from the memory cell is performed in the following manner. A high voltage (e.g., 5 V) is applied to the control gate 71, a low voltage (e.g., 1 V) is applied to the drain 74, and a low voltage (e.g., 0 V) is applied to the source 73. The current flowing at this point is amplified by a sensing amplifier provided in the flash memory, wherein it is determined whether the data indicates "1" or "0".

For writing data, the voltage applied to the drain 74 is set to be lower than the voltage applied to the control gate 71 as described above. The voltages are set in such manner so as to avoid the undesirable situation, to a maximum possible extent, where data is being weakly written in a parasitic manner to a memory cell (soft programming) of which no data is intended to be written. Without the above-mentioned settings, such undesirable situation may occur because the word lines and the bit lines are each connected to a plurality of memory cells 70.

In a flash memory having the above-described structure, it requires highly complicated control to perform reliable data writing and data erasing. Many flash memories used today include a control circuit referred to as a "state machine" for performing automatic data writing and erasing in order to make the flash memory to be easier to use for the user.

FIG. 3 is an exemplary block diagram showing a structure of a flash memory including a state machine.

The flash memory includes a state machine 91, a flash memory cell array 94, a peripheral circuit 93, a flash control bus 92, an address pad 95, and an input/output (I/O) pad 96. The peripheral circuit 93 includes a writing/erasing voltage generator 931, a row decoder 932, a column decoder 933, a sensing amplifier 934, an input/output (I/O) buffer 935, and an address register 936. During the normal operation of the flash memory, the state machine 91 acting as a control circuit controls the above-mentioned components in the peripheral circuit 93 when necessary.

One conventional method for inspecting a memory area of a semiconductor memory device in which the memory area is controlled by a control circuit is described in Japanese Laid-Open Patent Publication No. 60-85500. According to this method, data to be written and data to be read are obtained by directly connecting the I/O terminal and the memory area to each other using a switching circuit. Thus, the data is obtained without being sent through peripheral circuits during the inspection. FIG. 4 is a partial block diagram of a flash memory, in which the I/O terminal and the memory area can be connected to each other. The peripheral circuit and the memory area are omitted in FIG. 4 for simplicity.

As shown in FIG. 4, an address pad 104 and an I/O pad 105 which are respectively connected to an address bus 107 and a data bus 108 for the normal operation can be switched to be connected to a control bus 106 for performing the memory operation by the switching circuits 102 and 103. The memory operation includes data writing, erasing and reading. A signal for disabling a state machine 101 (DS signal) is also input to the switching circuits 102 and 103. When the DS signal is "ON", the address pad 104 and the I/O pad 105 are connected to the control bus 106; and when the DS signal is "OFF", the address pad 104 and the I/O pad 105 are respectively connected to the address bus 107 and the data bus 108. By such a method, signals used for performing the memory operation can be sent to an external inspection apparatus (not shown) without increasing the area of the flash memory.

Such an inspecting method has the following problem. Since a signal from the I/O terminal (I/O pad is directly sent to the memory area without passing through a peripheral circuit (including a writing/erasing voltage generator and a sensing amplifier), different levels of voltages need to be applied to different parts of the memory cell from outside as described above. This requires more complicated control and thus requires a higher quality inspection apparatus. In the above-mentioned publication, the method described in Japanese Laid-Open Patent Publication No. 60-85500 above is used only for inspecting the memory area, but is not used for inspecting a peripheral circuit required for memory operation, namely, a writing/erasing voltage generator and the like.

In general, a separate or external inspection apparatus performs inspections by storing a test program. Since the cost for the inspection apparatus usually needs to be minimized, such an external inspection apparatus is implemented to be operable at a lower speed than the operation rate of the flash memory, which is to be inspected, is often used. For example, when the original operation frequency is 5 MHz, the cycle time of inspection is about 200 nsec.

In another conventional method for inspecting a flash memory, the inspection is performed using only the flash memory to be inspected. Such a method will be referred to as a "self-test". FIG. 5 is a block diagram of a flash memory 111 which can be inspected by a self test.

As shown in FIG. 5, the flash memory 111 includes a main memory (for example, a flash memory cell array) 112, an additional memory (for example, a RAM or a ROM) 113, and a state machine 114 acting as a control circuit. The additional memory 113 includes a test program stored therein.

The self test is performed in the following manner. An inspection start signal TEST is turned "ON" in order to place the flash memory 111 in a self-test mode. Then, the state machine 114 drives a control bus 115 in the flash memory 111 based on the test program stored in the additional memory 113, thereby starting the inspection. The inspection results are output to the I/O port (not shown).

Since the operation rate of the self test is basically equal to the operation rate of the state machine 114, the inspection can be performed at a higher rate than using an external inspection apparatus. For example, when the original operation frequency is 20 MHz, the cycle time of inspection is about 50 nsec. However, such a method requires an additional memory area for storing the test program, which increases the area of the flash memory.

The self test has another disadvantage in that the items which can be inspected are limited regardless of the size of the area for storing the test program. For example, the time period necessary for writing, erasing and reading cannot be measured, and the electric current consumed while the flash memory is in the operation mode and during the wait state cannot be measured.

Accordingly, in light of the disadvantages associated with the above-mentioned methods, there is a strong need in the art for a cost effective method for inspecting a non-volatile semiconductor device in a short period of time without having to increase the area of the non-volatile semiconductor memory device and/or using an expensive inspection apparatus.

SUMMARY OF THE INVENTION

According to one aspect of the invention, a method for inspecting a semiconductor memory device by using an inspection microcomputer and a memory for storing a test program for the inspection is provided. The semiconductor memory device includes a non-volatile memory area, a peripheral circuit thereof, a control circuit for controlling writing and erasing of data to and from the non-volatile memory area via the peripheral circuit, and a control bus for connecting the control circuit and the peripheral circuit. The method includes the steps of: deactivating the control circuit; connecting the inspection microcomputer and the memory to the control bus; and inspecting the peripheral circuit and the non-volatile memory area by the inspection microcomputer.

In one embodiment of the invention, the method for inspecting a semiconductor memory device further includes the step of generating the control signal based on the test program stored in the memory.

According to another aspect of the invention, a method for inspecting an one-chip semiconductor memory device by using an inspection microcomputer and a memory for storing a test program for the inspection is provided. The semiconductor memory device including, on a single chip, a non-volatile memory area, a peripheral circuit thereof, a control circuit for controlling writing and erasing of data to and from the non-volatile memory area via the peripheral circuit, a control bus for connecting the control circuit and the peripheral circuit, and an output terminal for sending a signal from the control bus outside the chip. The method includes the steps of: inputting a control signal to the chip from the inspection microcomputer; deactivating the control circuit based on the control signal; connecting the inspection microcomputer to the output terminal; and inspecting the peripheral circuit and the non-volatile memory area by the inspection microcomputer.

In one embodiment of the invention, the method for inspecting a semiconductor memory device further includes the step of generating the control signal based on the test program stored in the memory.

According to still another aspect of the invention a method for inspecting a semiconductor memory device by using an inspection apparatus and an inspection microcomputer provided with a memory storing a test program for the inspection is provided. The semiconductor memory device including a non-volatile memory area, a peripheral circuit thereof, a control circuit for controlling writing and erasing of data to and from the non-volatile memory area via the peripheral circuit, and a control bus for connecting the control circuit and the peripheral circuit. The method includes the steps of: deactivating the control circuit; selectively connecting one of the inspection apparatus and the inspection microcomputer to the control bus; and inspecting the peripheral circuit and the non-volatile memory area using the selected one of the inspection apparatus and the inspection microcomputer.

In one embodiment of the invention, the step of selectively connecting is performed by a switching circuit.

According to still another aspect of the invention, a system for inspecting a semiconductor memory device including a non-volatile memory area, a peripheral circuit thereof, a control circuit for controlling writing and erasing of data to and from the non-volatile memory area via the peripheral circuit, and a control bus for connecting the control circuit and the peripheral circuit is provided. The system includes: an inspection microcomputer for inspecting the peripheral circuit and the non-volatile memory area; and a memory for storing a test program for the inspection. The inspection micro-computer outputs a control signal so as to deactivate the control circuit before performing the inspection by connecting to the control bus.

In one embodiment of the invention, the inspection microcomputer generates the control signal based on the test program stored in the memory.

In another embodiment of the invention, the memory is built in the inspection microcomputer.

In still another aspect of the invention, the memory is externally connected to the inspection micro-computer.

According to still another aspect of the invention, a system for inspecting a semiconductor memory device including a non-volatile memory area, a peripheral circuit thereof, a control circuit for controlling writing and erasing of data to and from the non-volatile memory area via the peripheral circuit, and a control bus for connecting the control circuit and the peripheral circuit is provided. The system includes: an inspection apparatus and an inspection microcomputer for inspecting the peripheral circuit and the non-volatile memory area, one of the inspection apparatus and the inspection micro-computer outputting first and second control signals; and a switching circuit for selectively connecting one of the inspection apparatus and the inspection microcomputer to the control bus based on the first control signal. The first control signal is generated based on the type of inspection to be performed, and the second control signal is input to the semiconductor memory device so as to deactivate the control circuit before performing the inspection.

In one embodiment of the invention, the inspection microcomputer is provided with a memory storing a test program for the inspection, the memory being built in the inspection microcomputer.

In another embodiment of the invention, the inspection microcomputer is provided with a memory storing a test program for the inspection, the memory being externally connected to the inspection microcomputer.

According to still another aspect of the invention, a one-chip semiconductor memory device including, on a single chip, a non-volatile memory area, a peripheral circuit thereof, a control circuit for controlling writing and erasing of data to and from the non-volatile memory area via the peripheral circuit, and a control bus for connecting the control circuit and the peripheral circuit, the semiconductor memory device being inspectable in an inspection system including an inspection microcomputer and a memory for storing a test program for the inspection. The semiconductor memory device further includes: an output terminal for sending a signal from the control bus outside the chip, connectable to the inspection microcomputer; and means for receiving a control signal output from the inspection microcomputer and for deactivating the control circuit based on the control signal.

According to the present invention, the semiconductor memory device is inspected by an external microcomputer. Such a system increases the inspection rate and thus shortens the inspection time compared to an inspection performed by a general inspection apparatus.

Moreover, using a microcomputer and a ROM or a RAM for storing the test program costs significantly less than increasing the processing rate of the general inspection apparatus.

Thus, the invention described herein makes possible the advantages of providing a method and system for inspecting a non-volatile semiconductor memory device in a shorter period of time without increasing the area of the non-volatile semiconductor memory device or without using an expensive inspection apparatus.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 6:
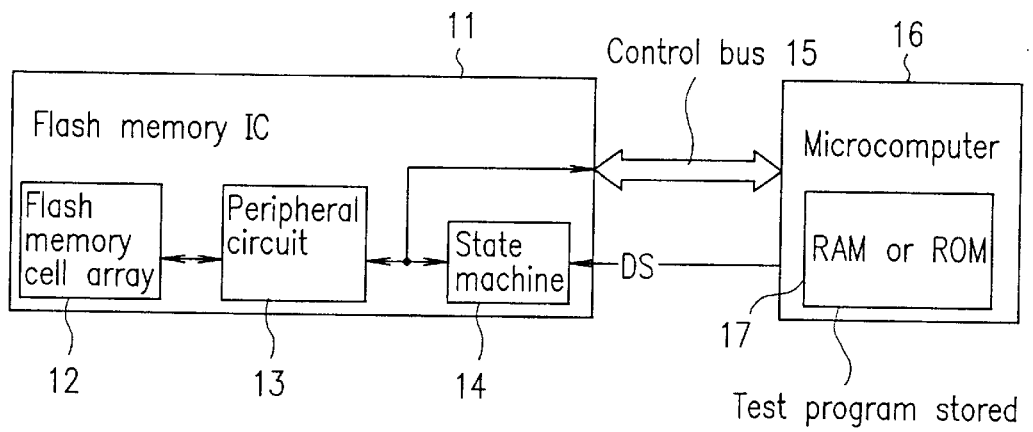
FIG. 6 is a schematic view of a system for inspecting a flash memory in a first example according to the present invention.

FIG. 6 is a schematic view of a system for inspecting a flash memory IC 11 by a method according to a first example of the present invention. As shown in FIG. 6, the flash memory IC 11 is connected to a microcomputer 16 used for inspection (also referred to as an "inspection microcomputer").

Figure 1:
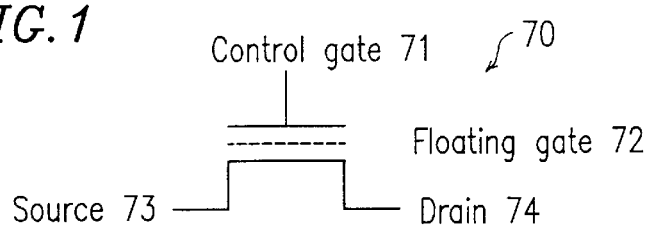
FIG. 1 is a schematic view of an exemplary structure of a memory cell in a flash memory.
Figure 2:
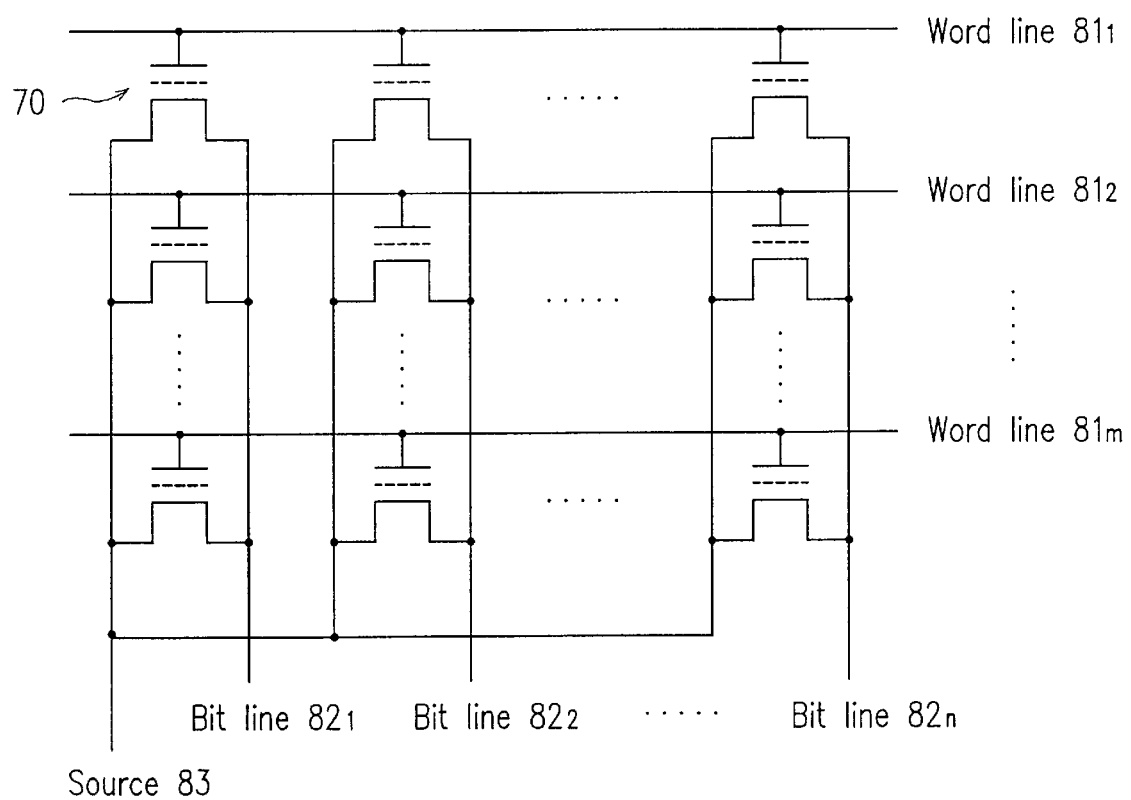
FIG. 2 is a partial circuit diagram of the flash memory including a plurality of memory cells as shown in FIG. 1.
Figure 3:
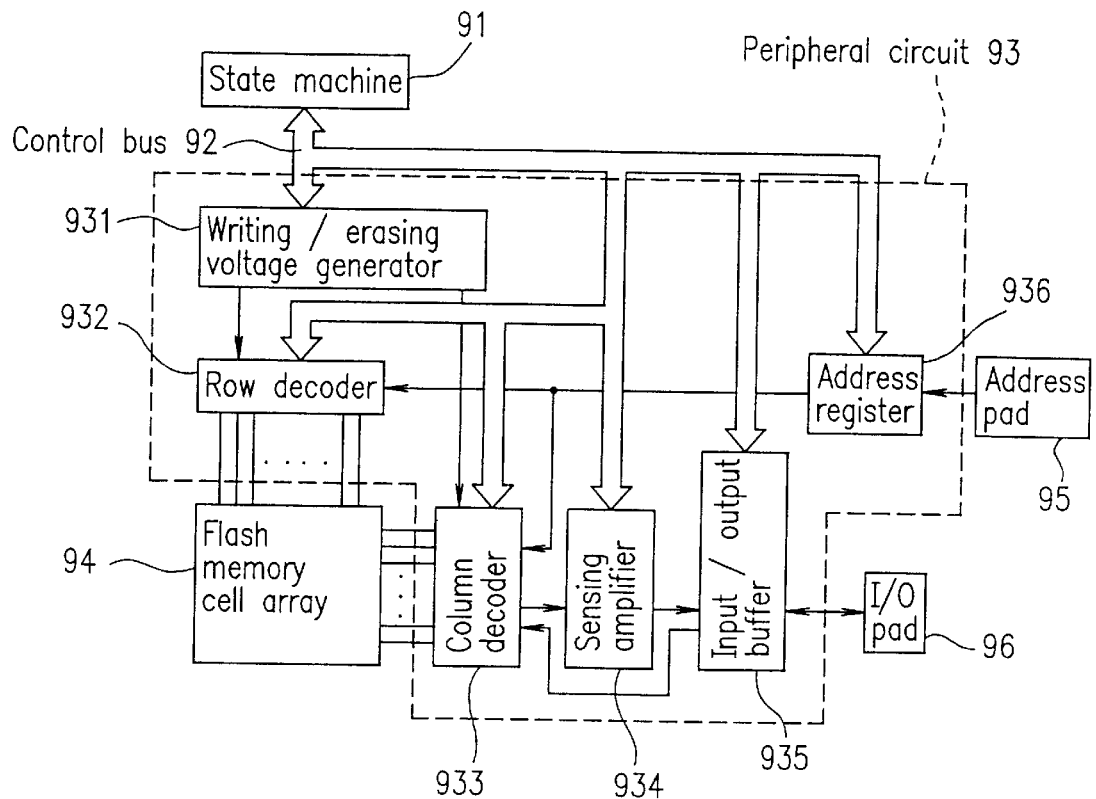
FIG. 3 is a block diagram of a conventional flash memory.

The flash memory IC 11 includes a flash memory cell array 12, a peripheral circuit 13 required for the memory operation, a state machine 14 acting as a control circuit, and a control bus 15. The peripheral circuit 13 has the same structure as that of the peripheral circuit 93 shown in FIG. 3. Namely, the peripheral circuit 13 includes the writing/erasing voltage generator 931, the row decoder 932, the column decoder 933, the sensing amplifier 934, the I/O buffer 935 and the address register 936.

The microcomputer 16 includes an inner memory (e.g., a RAM or ROM) 17. The inner memory 17 includes a test program stored therein.

According to the method of the first example, the flash memory IC 11 is inspected in the following manner.

The microcomputer 16 initiates inspection based on the test program stored in the inner memory 17; namely, a DS signal output from the microcomputer 16 is set "ON" to disable or deactivate the state machine 14 in the flash memory 11. Thus, the state machine 14 is completely disconnected from the control bus 15. After confirming the complete disconnection of the state machine 14 from the control bus 15, the microcomputer 16 controls the peripheral circuit 13 through the control bus 15 and inspects the peripheral circuit 13. Since the inspection is performed at the processing rate of the microcomputer 16, the rate of inspection can be as high as the operation rate of the flash memory 11 such as, for example, in the self-test, or even higher, when the microcomputer 16 is operable at a higher processing rate.

Figure 4:
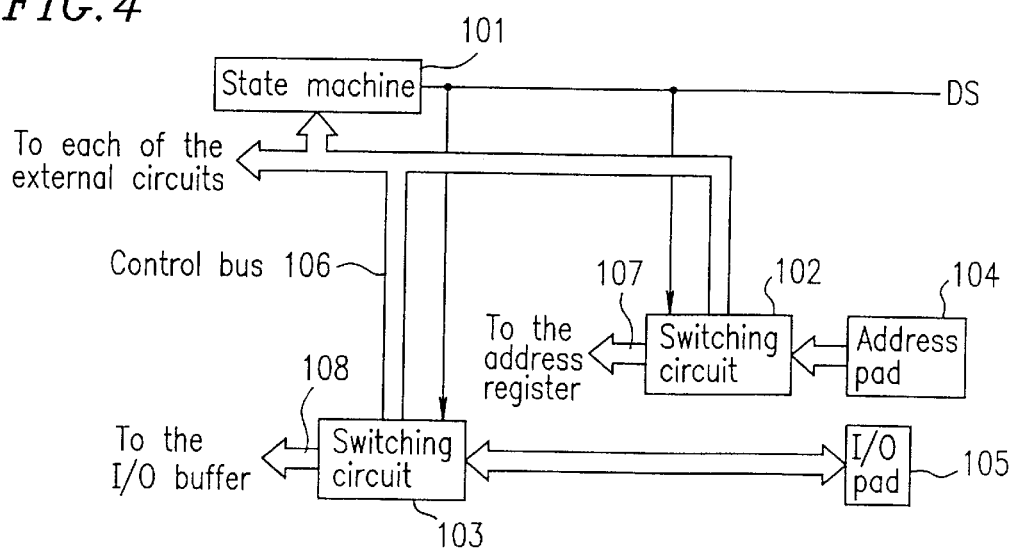
FIG. 4 is a partial block diagram of another conventional flash memory.
Figure 5:
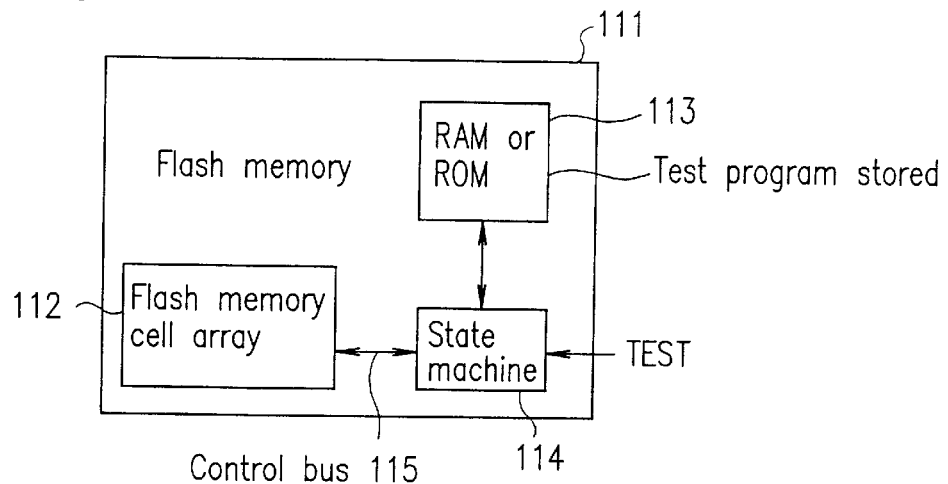
FIG. 5 is a block diagram of still another conventional flash memory.

The signal from the control bus 15 can be sent outside the flash memory 11 using, for example, the structure shown in FIG. 4.

Specific items for inspection of the peripheral circuit 13 include: (1) if data is written into the address register properly; (2) if the writing/erasing voltage generator generates a prescribed level of voltage; and (3) if the row decoder, the column decoder, the sensing amplifier, the I/O buffer, and the like operate properly. By inspecting the peripheral circuit 13, the flash memory cell array 12 can be inspected indirectly. Items for indirect inspection of the flash memory cell array 12 can include items regarding reliability such as, for example: (1) if data writing to and data erasing from all the flash memory cells can be performed properly; and (2) if data rewriting can be performed properly in all the flash memory cells a prescribed number of times for a prescribed time period as predetermined.

The inspection results can be indicated by sending a "pass" flag to the I/O port of the microcomputer 16 when the test program is executed without fail and sending a "fail" flag to the I/O port when the execution fails.

EXAMPLE 2

Figure 7:
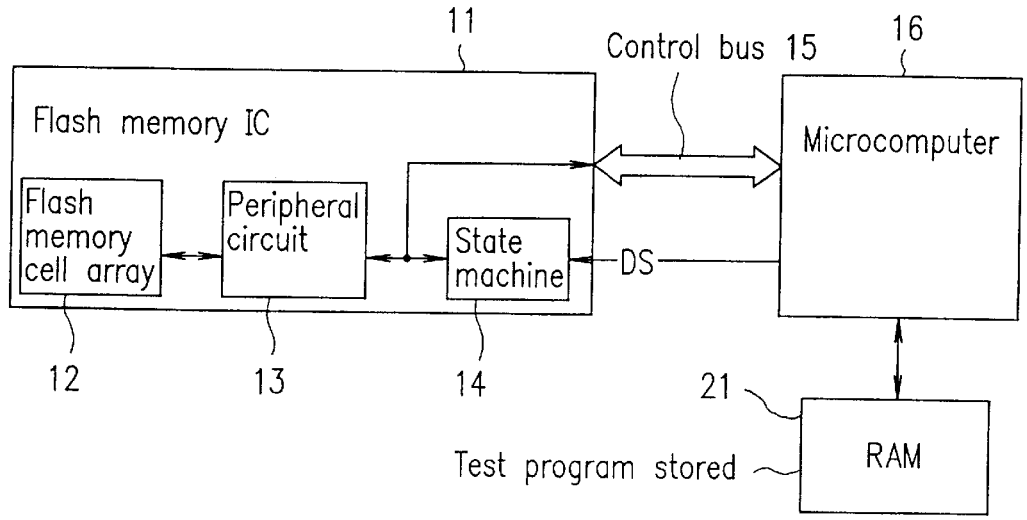
FIG. 7 is a schematic view of a system for inspecting a flash memory in a second example according to the present invention.

FIG. 7 is a schematic view of a system for inspecting a flash memory IC 11 by a method according to a second example of the present invention. As shown in FIG. 7, the flash memory IC 11 is connected to a microcomputer 16, which is further connected to a RAM 21 storing a test program.

Whereas a RAM or a ROM storing the test program as the inner memory 17 is included in the microcomputer 16 in the first example, the RAM 21 storing the test program is externally connected to the microcomputer 16 in the second example. The system shown in FIG. 7 has a substantially identical structure to that of the system shown in FIG. 6 except for the above-described point. The system shown in FIG. 7 operates based on the same principles as the system shown in FIG. 6.

EXAMPLE 3

Figure 8:
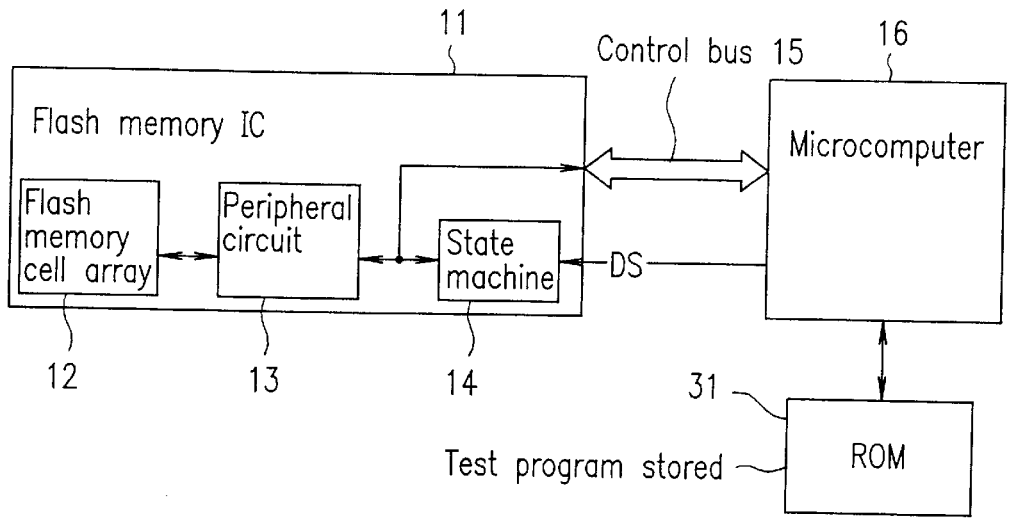
FIG. 8 is a schematic view of a system for inspecting a flash memory in a third example according to the present invention.

FIG. 8 is a schematic view of a system for inspecting a flash memory IC 11 by a method according to a third example of the present invention. The system shown in FIG. 8 has a substantially identical structure to that of the system in FIG. 7 except that a ROM 31 is externally connected to the microcomputer 16 in lieu of the RAM 21.

EXAMPLE 4

Figure 9:
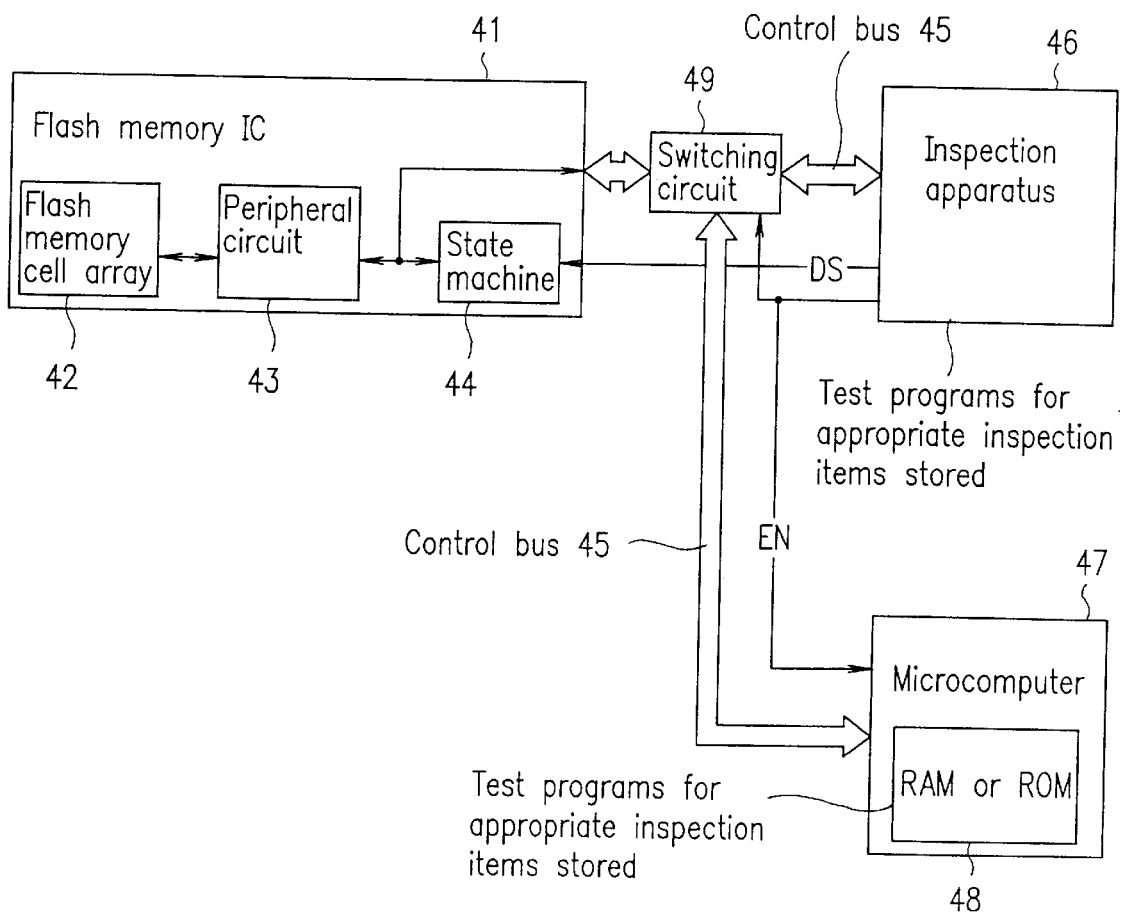
FIG. 9 is a schematic view of a system for inspecting a flash memory in a fourth example according to the present invention.

FIG. 9 is a schematic view of a system for inspecting a flash memory IC 41 by a method according to a fourth example of the present invention. By the system shown in FIG. 9, either a method using a microcomputer described in the first example or a conventional method using a separate inspection apparatus can be selected. The selection is performed in accordance with the inspection items so as to minimize the inspection time.

As shown in FIG. 9, the system includes a flash memory IC 41, and a microcomputer 47 and an inspection apparatus 46 both connectable to the flash memory IC 41. The microcomputer 47 includes an inner memory 48 (e.g., example, a RAM or ROM). The inspection apparatus 46 stores a test program regarding inspection items to be performed by the inspection apparatus 46, and the inner memory 48 of the microcomputer 47 stores a test program regarding inspection items to be inspected by the microcomputer 47. The system shown in FIG. 9 further includes a switching circuit 49 for connecting the flash memory IC 41 to either the inspection apparatus 46 or the microcomputer 47 in accordance with the method to be employed.

The flash memory IC 41 has a similar structure as that of the flash memory 11 shown in FIG. 6. Namely, the flash memory 41 includes a flash memory cell array 42, a peripheral circuit 43, and a state machine 44 coupled via the switching circuit 49 and the control bus 45 to the inspection apparatus 46.

The inspection according to the fourth example of the present invention is performed in the following manner.

The inspection apparatus 46 initiates inspection based on the test program stored therein; namely, the DS signal output from the inspection apparatus 46 is set "ON" to disable or deactivate the state machine 44 in the flash memory 41. Thus, the state machine 44 is completely disconnected from the control bus 45. After confirming the complete disconnection of the state machine 44 from the control bus 45, the inspection apparatus 46 determines whether the inspection of a first item is to be performed by the inspection apparatus 46 or the microcomputer 47.

If the inspection of the first item is to be performed by the inspection apparatus 46, an EN (enable) signal which is input to the switching circuit 49 is set "OFF". When the EN signal is "OFF", the microcomputer 47 is disabled, and the flash memory IC 41 is connected to the inspection apparatus 46 via the switching circuit 49. Thus, the inspection apparatus 46 controls the flash memory IC 41 through the control bus 45 and proceeds with the inspection.

If the inspection of the first item is to be performed by the microcomputer 47, the EN signal which is input to the switching circuit 49 is set "ON" to enable the microcomputer 47, and the flash memory IC 41 is connected to the microcomputer 47 via the switching circuit 49. Then, the microcomputer 47 controls the flash memory IC 41 through the control bus 45 and performs the inspection.

The inspection results obtained by the microcomputer 47 are sent to the inspection apparatus 46 through an I/O port provided solely for that purpose or an I/O port also acting as an I/O bus, and evaluated by the inspection apparatus 46. Upon receiving the inspection results, the inspection apparatus 46 initiates the next test program for a second inspection item.

Whether the inspection is to be performed by an inspection apparatus or a microcomputer is basically determined based on by which method the inspection can be performed in a shorter time period. For example, inspections which are preferably inspected by an inspection apparatus include measurement of time period necessary for data writing, erasing, reading, etc., and measurement of the current consumed while the flash memory is in the operation mode and during the wait state, and measurement of the leak current through the I/O pins or terminals. These inspections involve evaluation of analog values and are not suitable for a microcomputer.

Inspections which are preferably inspected by a microcomputer include inspection of the peripheral circuit. Such an inspection can be performed faster by a microcomputer than an inspection apparatus.

In the fourth example, the inspection apparatus 46 controls the microcomputer 47. Needless to say, the microcomputer 47 can likewise control the inspection apparatus 46. In such a case, the DS signal and the EN signal are output from the microcomputer 47, and the inspection results obtained by the inspection apparatus 46 are sent to the microcomputer 47.

EXAMPLE 5

Figure 10:
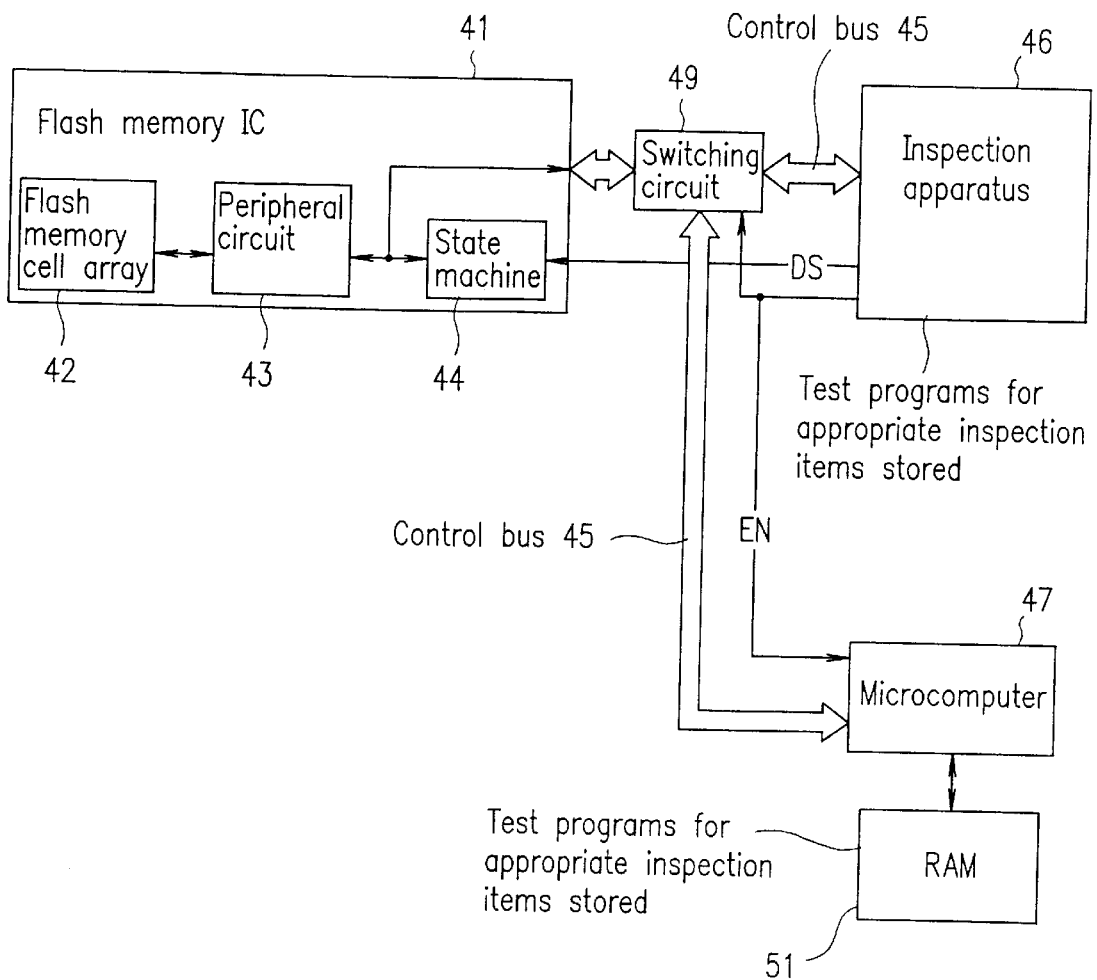
FIG. 10 is a schematic view of a system for inspecting a flash memory in a fifth example according to the present invention.

FIG. 10 is a schematic view of a system for inspecting a flash memory IC 41 by a method according to a fifth example of the present invention. As shown in FIG. 10, the flash memory IC 41 is connected to a microcomputer 47, which is further connected to a RAM 51 storing a test program for the inspection.

Whereas a RAM or a ROM storing the test program as the inner memory 48 is included in the microcomputer 47 in the fourth example, the RAM 51 storing the test program is externally connected to the microcomputer 47 in the fifth example. The system shown in FIG. 10 has a substantially identical structure to that of the system shown in FIG. 9 except for the above-described point. The system shown in FIG. 10 operates based on the same principles as the system shown in FIG. 9.

EXAMPLE 6

Figure 11:
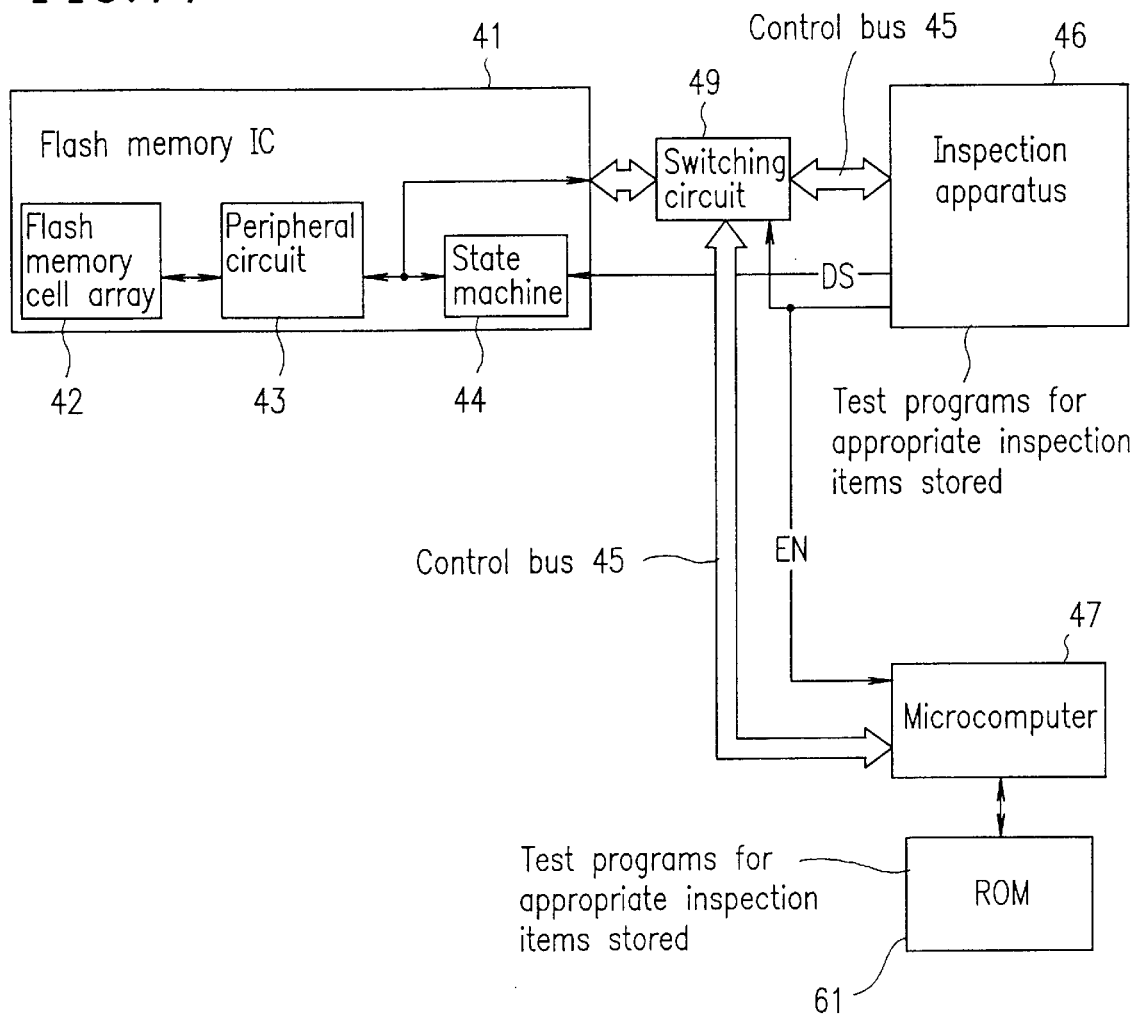
FIG. 11 is a schematic view of a system for inspecting a flash memory in a sixth example according to the present invention.

FIG. 11 is a schematic view of a system for inspecting a flash memory IC 41 by a method according to a sixth example of the present invention. The system shown in FIG. 11 has a substantially identical structure to that of the system shown in FIG. 10 except that a ROM 61 is externally connected to the microcomputer 47 in lieu of the RAM 51.

In the first through sixth examples, a method for inspecting a flash memory is described. It is to be appreciated that the present invention is applicable to a non-volatile semiconductor memory device controlled by a control circuit, regardless of whether the control circuit is integrated on one chip with the flash memory or not.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for inspecting a semiconductor memory device by using an inspection microcomputer and a memory for storing a test program for the inspection, the semiconductor memory device including a non-volatile memory area, a peripheral circuit thereof, a control circuit for controlling writing and erasing of data to and from the non-volatile memory area via the peripheral circuit, and a control bus for connecting the control circuit and the peripheral circuit, the method including the steps of:

deactivating the control circuit;

connecting the inspection microcomputer and the memory to the control bus; and inspecting the peripheral circuit and the non-volatile memory area by the inspection microcomputer.

2. A method for inspecting a semiconductor memory device according to claim 1, further including the step of generating a control signal for controlling the inspection microcomputer based on the test program stored in the memory.

3. A method for inspecting an one-chip semiconductor memory device by using an inspection microcomputer and a memory for storing a test program for the inspection, the semiconductor memory device including, on a single chip, a non-volatile memory area, a peripheral circuit thereof, a control circuit for controlling writing and erasing of data to and from the non-volatile memory area via the peripheral circuit, a control bus for connecting the control circuit and the peripheral circuit, and an output terminal for sending a signal from the control bus outside the chip, the method comprising the steps of:

inputting a control signal to the chip from the inspection microcomputer;

deactivating the control circuit based on the control signal;

connecting the inspection microcomputer to the output terminal; and inspecting the peripheral circuit and the non-volatile memory area by the inspection microcomputer.

4. A method for inspecting a semiconductor memory device according to claim 3, further including the step of generating the control signal based on the test program stored in the memory.

5. A method for inspecting a semiconductor memory device by using an inspection apparatus and an inspection microcomputer provided with a memory storing a test program for the inspection, the semiconductor memory device including a non-volatile memory area, a peripheral circuit thereof, a control circuit for controlling writing and erasing of data to and from the non-volatile memory area via the peripheral circuit, and a control bus for connecting the control circuit and the peripheral circuit, the method including the steps of:

deactivating the control circuit;

selectively connecting one of the inspection apparatus and the inspection microcomputer to the control bus; and inspecting the peripheral circuit and the non-volatile memory area using the selected one of the inspection apparatus and the inspection microcomputer.

6. A method for inspecting a semiconductor memory device according to claim 5, wherein the step of selectively connecting is performed by a switching circuit.

7. A system for inspecting a semiconductor memory device including a non-volatile memory area, a peripheral circuit thereof, a control circuit for controlling writing and erasing of data to and from the non-volatile memory area via the peripheral circuit, and a control bus for connecting the control circuit and the peripheral circuit, the system comprising:

an inspection microcomputer for inspecting the peripheral circuit and the non-volatile memory area; and a memory for storing a test program for the inspection, wherein the inspection microcomputer outputs a control signal so as to deactivate the control circuit before performing the inspection by connecting to the control bus.

8. A system for inspecting a semiconductor memory device according to claim 7, wherein the inspection microcomputer generates the control signal based on the test program stored in the memory.

9. A system for inspecting a semiconductor memory device according to claim 7, wherein the memory is built in the inspection microcomputer.

10. A system for inspecting a semiconductor memory device according to claim 7, wherein the memory is externally connected to the inspection microcomputer.

11. A system for inspecting a semiconductor memory device including a non-volatile memory area, a peripheral circuit thereof, a control circuit for controlling writing and erasing of data to and from the non-volatile memory area via the peripheral circuit, and a control bus for connecting the control circuit and the peripheral circuit, the system including:

- an inspection apparatus and an inspection microcomputer for inspecting the peripheral circuit and the non-volatile memory area, one of the inspection apparatus and the inspection microcomputer outputting first and second control signals; and
- a switching circuit for selectively connecting one of the inspection apparatus and the inspection microcomputer to the control bus based on the first control signal,
- wherein the first control signal is generated based on the type of inspection to be performed, and the second control signal is input to the semiconductor memory device so as to deactivate the control circuit before performing the inspection.

12. A system for inspecting a semiconductor memory device according to claim 11, wherein the inspection microcomputer is provided with a memory storing a test program for the inspection, the memory being built in the inspection microcomputer.

13. A system for inspecting a semiconductor memory device according to claim 11, wherein the inspection microcomputer is provided with a memory storing a test program for the inspection, the memory being externally connected to the inspection microcomputer.

14. A one-chip semiconductor memory device including, on a single chip, a non-volatile memory area, a peripheral circuit thereof, a control circuit for controlling writing and erasing of data to and from the non-volatile memory area via the peripheral circuit, and a control bus for connecting the control circuit and the peripheral circuit, the semiconductor memory device being inspectable in an inspection system including an inspection microcomputer and a memory for storing a test program for the inspection, the semiconductor memory device further including:

- an output terminal for sending a signal from the control bus outside the chip, connectable to the inspection microcomputer; and
- means for receiving a control signal output from the inspection microcomputer and for deactivating the control circuit based on the control signal.

* * * * *